(12) United States Patent
Lin et al.

(10) Patent No.: US 9,019,770 B2
(45) Date of Patent: Apr. 28, 2015

(54) DATA READING METHOD, AND CONTROL CIRCUIT, MEMORY MODULE AND MEMORY STORAGE APPARATUS AND MEMORY MODULE USING THE SAME

(71) Applicant: Phison Electronics Corp., Miaoli (TW)

(72) Inventors: Wei Lin, Taipei (TW); Tien-Ching Wang, Kaohsiung (TW); Kuo-Hsin Lai, Hsinchu County (TW); Yu-Cheng Hsu, Yilan County (TW); Kuo-Yi Cheng, Taipei (TW)

(73) Assignee: Phison Electronics Corp., Miaoli (TW)

( * ) Notice: Subject to any disclaimer, the term of this patent is extended or adjusted under 35 U.S.C. 154(b) by 197 days.

(21) Appl. No.: 13/901,571

(22) Filed: May 24, 2013

(65) Prior Publication Data
US 2014/0293696 A1    Oct. 2, 2014

(30) Foreign Application Priority Data

Mar. 26, 2013 (TW) .............................. 102110698 A

(51) Int. Cl.
*G11C 16/04* (2006.01)
*G11C 16/26* (2006.01)

(52) U.S. Cl.
CPC ...................................... *G11C 16/26* (2013.01)

(58) Field of Classification Search
USPC ............................ 365/185.18, 185.12, 185.22
See application file for complete search history.

(56) References Cited

U.S. PATENT DOCUMENTS

2006/0271323 A1 *  11/2006  Baldwin et al. ............... 702/117

* cited by examiner

*Primary Examiner* — Vu Le
(74) *Attorney, Agent, or Firm* — Jianq Chyun IP Office

(57) ABSTRACT

A data reading method for a rewritable non-volatile memory module is provided. The method includes applying a test voltage to a word line of the rewritable non-volatile memory module to read a plurality of verification bit data. The method also includes calculating a variation of bit data identified as a first status among the verification bit data, obtaining a new read voltage value set based on the variation, and updating a threshold voltage set for the word line with the new read voltage value set. The method further includes using the updated threshold voltage set to read data from a physical page formed by memory cells connected to the word line. Accordingly, storage states of memory cells in the rewritable non-volatile memory module can be identified correctly, thereby preventing data stored in the memory cells from losing.

25 Claims, 12 Drawing Sheets

DATA READING METHOD, AND CONTROL CIRCUIT, MEMORY MODULE AND MEMORY STORAGE APPARATUS AND MEMORY MODULE USING THE SAME

CROSS-REFERENCE TO RELATED APPLICATION

This application claims the priority benefit of Taiwan application serial no. 102110698, filed on Mar. 26, 2013. The entirety of the above-mentioned patent application is hereby incorporated by reference herein and made a part of this specification.

BACKGROUND

1. Technology Field

The present invention relates to a data read method, a control circuit, a rewritable non-volatile memory module and a memory storage apparatus using the method.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

FIG. 1 is a schematic diagram illustrating a flash memory device according to the related art.

With reference to FIG. 1, a flash memory device 1 includes a charge-trapping layer 2 for storing electrons, a control gate 3 for applying a voltage, a tunnel oxide layer 4, and an interpoly dielectric layer 5. When it is intended to write data into the flash memory device 1, a threshold voltage of the flash memory device 1 may be changed by injecting electrons into the charge-trapping layer 2. Accordingly, a digital-level state of the flash memory device 1 is defined to implement a function of storing data. Here, the process of injecting the electrons to the charge-trapping layer 2 is referred to as a programming process. By contrast, when it is intended to remove the stored data, the injected electrons are removed from the charge-trapping layer 2, and thereby the flash memory device 1 is restored back to the default state before programming.

During writing and erasing operations, the flash memory device 1 deteriorates due to the frequent injection and removal of the electrons, thus increasing the speed of writing the electrons and extending the distribution of the threshold voltage. As a result, after the flash memory device 1 is programmed, the storage state of the flash memory device 1 is unlikely to be identified accurately, which results in the occurrence of error bits.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data reading method, a control circuit, a rewritable non-volatile memory module and a memory storage apparatus, which can correctly identify a storage state of memory cells which have worn.

In an exemplary embodiment of the present invention, a memory read method for a rewritable non-volatile memory module is provided, wherein the rewritable non-volatile memory module has a plurality of memory cells, a plurality of word lines and a plurality of bit lines, each of the memory cells electrically connected to one of the word lines and one of the bit lines, each of the memory cells stores at least one bit of data, each bit of data is identified as a first state or a second state according to a voltage and these memory cells constitute a plurality of physical pages. The data reading method includes applying a test voltage to a first word line among the word lines to read a plurality of verification bit data, wherein a threshold voltage set is set with a first read voltage value set and is assigned to the first word line. The data reading method further includes calculating a variation of bit data identified as a first state among the verification bit data, obtaining a second read voltage value set based on the variation, and updating the threshold voltage set with the second read voltage value set. The data reading method further includes reading data from a first physical page among the physical pages by applying the threshold voltage set updated with the second read voltage value set, wherein memory cells constituting the first physical page among the memory cells are electrically connected to the first word line.

In an exemplary embodiment of the present invention, a control circuit for read data from a plurality of memory cells of a rewritable non-volatile memory module is provided. The control circuit includes an interface and a memory management circuit. The interface is configured to electrically connected to the memory cells, a plurality of word lines and a plurality of bit lines, each of the memory cells electrically connected to one of the word lines and one of the bit lines, each of the memory cells stores at least one bit of data, each bit of data is identified as a first state or a second state according to a voltage and these memory cells constitute a plurality of physical pages. The memory management circuit is coupled to the interface and configured to apply a test voltage to a first word line among the word lines to read a plurality of verification bit data, wherein the memory management circuit sets a first read voltage value set as a threshold voltage set for the first word line. Additionally, the memory management circuit is further configured to calculate a variation of bit data identified as a first state among the verification bit data and obtain a second read voltage value set based on the variation. Furthermore, the memory management circuit is further configured to update the threshold voltage set with the second read voltage value set and read data from a first physical page among the physical pages by using the threshold voltage set updated with the second read voltage value set, wherein memory cells constituting the first physical page among the memory cells are electrically connected to the first word line.

According to an exemplary embodiment of the present invention, a memory storage apparatus including a connector, a rewritable non-volatile memory module and a memory controller is provided. The connector is configured to couple to the host system. The rewritable non-volatile memory module includes a plurality of memory cells, a plurality of word lines and a plurality of bit lines, each of the memory cells electrically connected to one of the word lines and one of the bit lines, each of the memory cells stores at least one bit of data, each bit of data is identified as a first state or a second state according to a voltage and these memory cells constitute a plurality of physical pages. The memory controller is coupled to the connector and the rewritable non-volatile memory module and configured to apply a test voltage to a first word line among the word lines to read a plurality of verification bit data, wherein the memory controller sets a first read voltage value set as a threshold voltage set for the first word line. Additionally, the memory controller is further configured to calculate a variation of bit data identified as a first state among the verification bit data and obtain a second read voltage value set based on the variation. Furthermore, the memory controller is further configured to update the threshold voltage set with the second read voltage value set and read data from a first physical page among the physical pages by using the threshold voltage set updated with the second read voltage value set, wherein memory cells constituting the first physical page among the memory cells are electrically connected to the first word line.

According to an exemplary embodiment of the present invention, a memory module including a plurality of word lines, a plurality of bit lines, a plurality of memory cells and a control circuit is provided. Each of the memory cells electrically connected to one of the word lines and one of the bit lines, each of the memory cells stores at least one bit of data, each bit of data is identified as a first state or a second state according to a voltage and these memory cells constitute a plurality of physical pages. The control circuit is coupled to the word lines, the bit lines and the memory cells and configured to apply a test voltage to a first word line among the word lines to read a plurality of verification bit data, wherein the control circuit sets a first read voltage value set as a threshold voltage set for the first word line. Additionally, the memory control circuit is further configured to calculate a variation of bit data identified as a first state among the verification bit data and obtain a second read voltage value set based on the variation. Furthermore, the control circuit is further configured to update the threshold voltage set with the second read voltage value set and read data from a first physical page among the physical pages by using the threshold voltage set updated with the second read voltage value set, wherein memory cells constituting the first physical page among the memory cells are electrically connected to the first word line.

In view of the above, the data reading method, the control circuit, the rewritable non-volatile memory module and the memory storage apparatus of the exemplary embodiments of the present invention can correctly identify the storage state of the memory cells, thereby preventing data stored in the memory cells from losing.

In order to make the aforementioned features and advantages of the present invention more comprehensible, embodiments accompanying figures are described in detail below.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
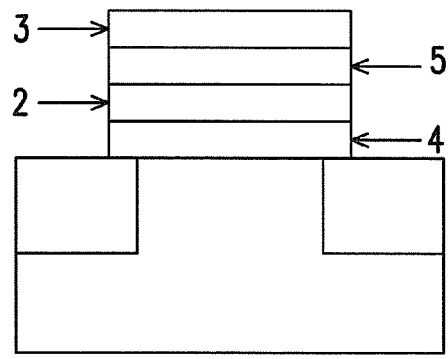
FIG. 1 is a schematic diagram illustrating a flash memory device according to the related art.

Reference will now be made in detail to the present exemplary embodiments of the present invention, examples of which are illustrated in the accompanying drawings. Wherever possible, the same reference numbers are used in the drawings and the description to refer to the same or like parts. Embodiments of the present invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more," and "at least one" can be used interchangeably herein.

A memory storage apparatus (i.e., a memory storage system) typically includes a flash memory module and a controller (i.e., a control circuit). The memory storage apparatus is usually used together with a host system, such that the host system can write data into or read data from the memory storage apparatus.

Figure 2:
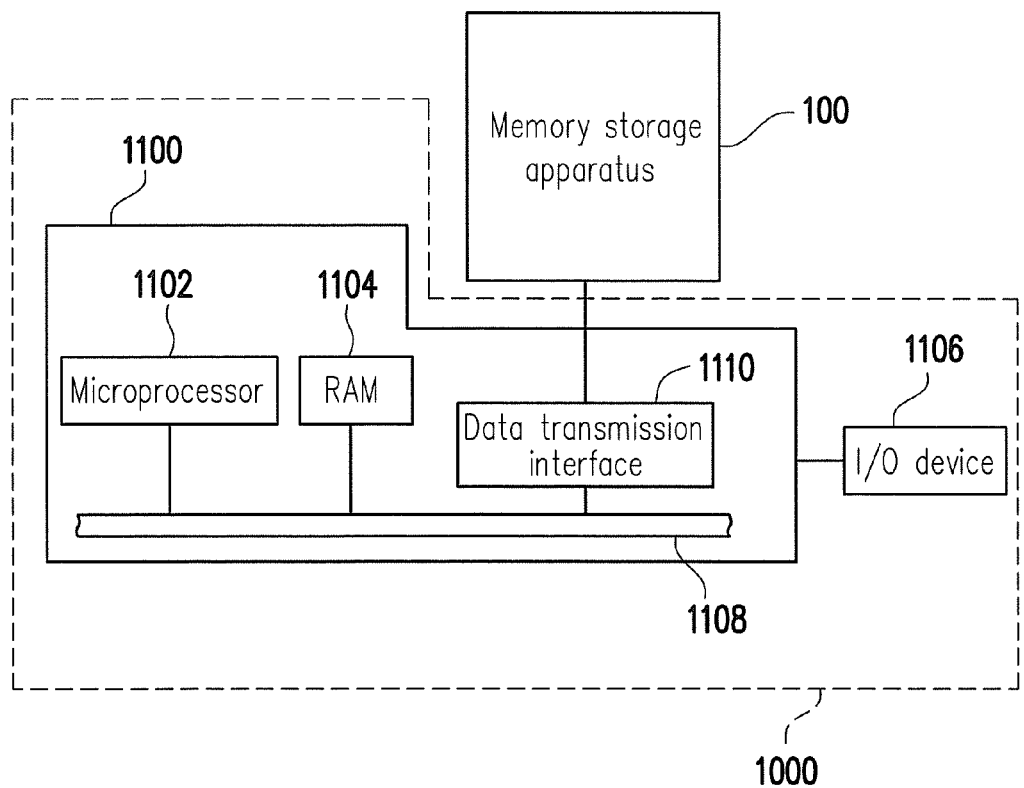
FIG. 2 illustrates a host system and a memory storage apparatus according to an exemplary embodiment.

FIG. 2 illustrates a host system and a memory storage apparatus according to an exemplary embodiment.

Figure 3:
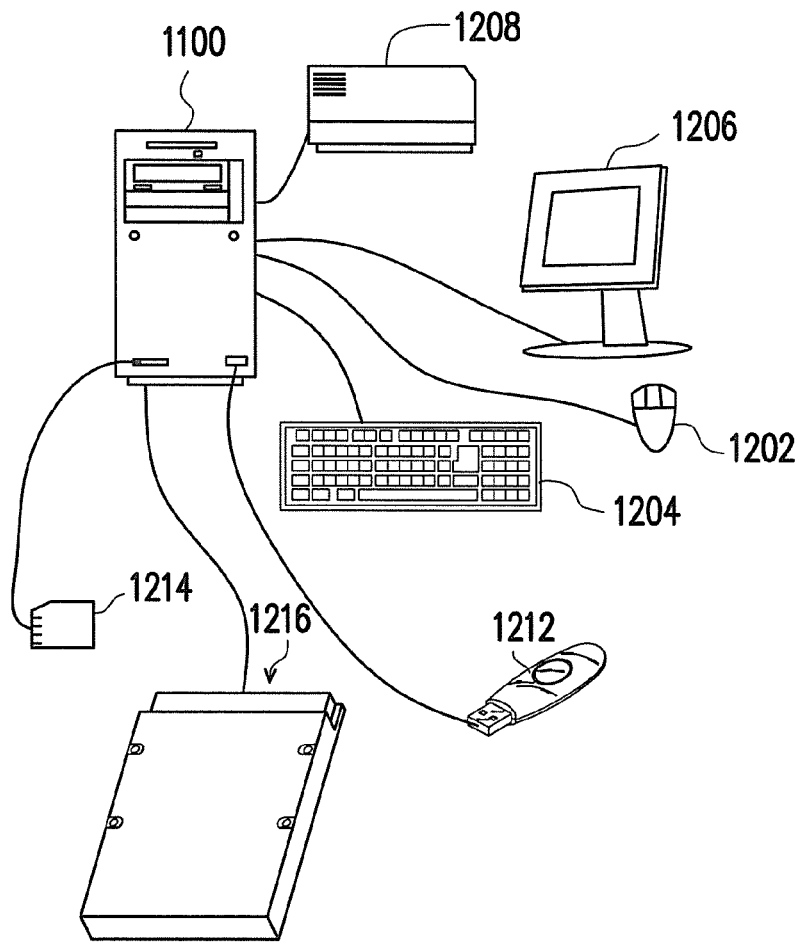
FIG. 3 schematically illustrates a computer, an input/output (I/O) device, and a memory storage apparatus according to an exemplary embodiment.

Referring to FIG. 2, a host system 1000 usually includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 3. It should be understood that the devices depicted in FIG. 3 should not be construed as limitations to the present disclosure, and the I/O device 1106 may include other devices as well.

In the exemplary embodiment of the present invention, the memory storage apparatus 100 is coupled to other devices of the host system 1000 through the data transmission interface 1110. By using the microprocessor 1102, the RAM 1104, and the I/O device 1106, the data can be written into or read from the memory storage apparatus 100. For instance, the memory storage apparatus 100 may be a non-volatile memory storage apparatus, such as a flash drive 1212, a memory card 1214, or a solid state drive (SSD) 1216 as shown in FIG. 3.

Figure 4:
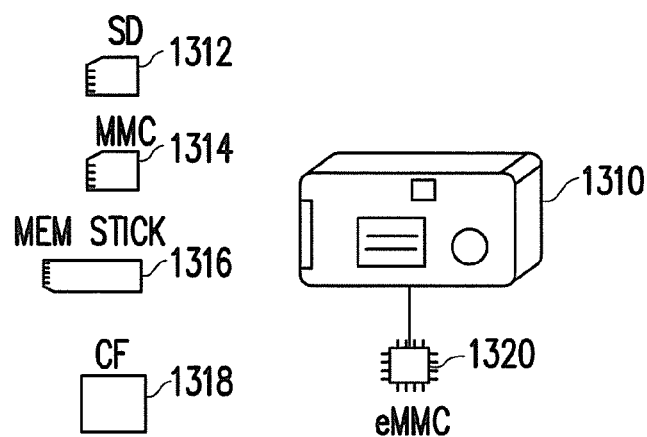
FIG. 4 illustrates a host system and a memory storage apparatus according to an exemplary embodiment.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318n or an embedded storage apparatus 1320 (as shown in FIG. 4). The embedded storage device 1320 includes an embedded MMC (eMMC). It should be noted that the eMMC is directly coupled to a substrate of the host system.

Figure 5:
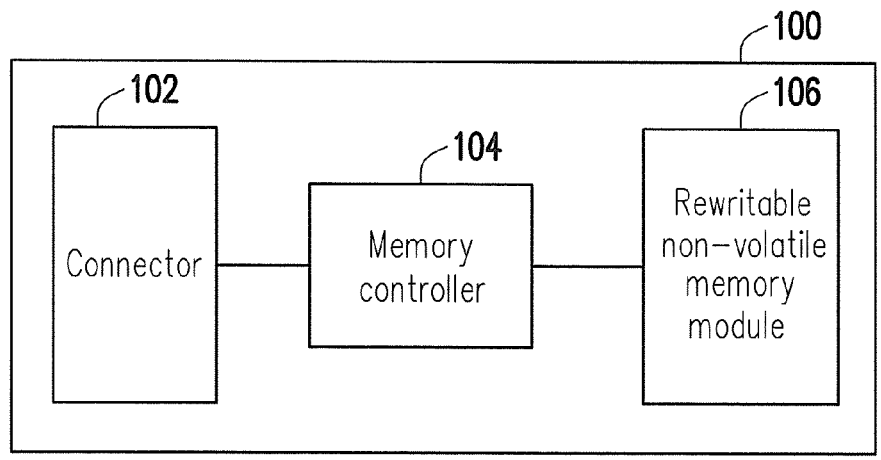
FIG. 5 is a schematic block diagram illustrating a memory storage apparatus according to the first exemplary embodiment.

FIG. 5 is a schematic block diagram illustrating a memory storage apparatus according to the first exemplary embodiment.

Referring to FIG. 5, the memory storage apparatus 100 includes a connector 102, a memory controller 104, and a rewritable non-volatile memory module 106.

In the present exemplary embodiment, the connector 102 is a connector complying with universal serial bus (USB). However, it should be understood that the present invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the secure digital (SD) standard, the serial advanced technology attachment (SATA) standard, the ultra-high speed-I (UHS-I) interface standard, the ultra-high speed-II (UHS-II) interface standard, the memory stick (MS) interface standard, the multimedia card (MMC) interface standard, the eMMC interface standard, the universal flash storage (UFS) interface standard, the compact flash (CF) standard, the integrated device electronics (IDE) standard, or other suitable standards.

The memory controller 104 is configured to execute a plurality of logic gates or control commands which are implemented in a hardware form or in a firmware form and performing the operations such as data writing, reading or erasing in the rewritable non-volatile memory module 106 according to the command of the host system 1000.

The rewritable non-volatile memory module 106 is coupled to the memory controller 104 and is configured to store the data written by the host system 1000. In the present exemplary embodiment, the rewritable non-volatile memory module 106 is a multi-level cell (MLC) NAND flash memory module, i.e., a memory cell can store 2 bits of data. However, the present invention is not limited thereto, and the rewritable non-volatile memory module 106 may also be a trinary level cell (TLC) NAND flash memory module (i.e., a memory cell can store 3 bits of data), other flash memory module or other memory module having the same characteristic.

Figure 6:
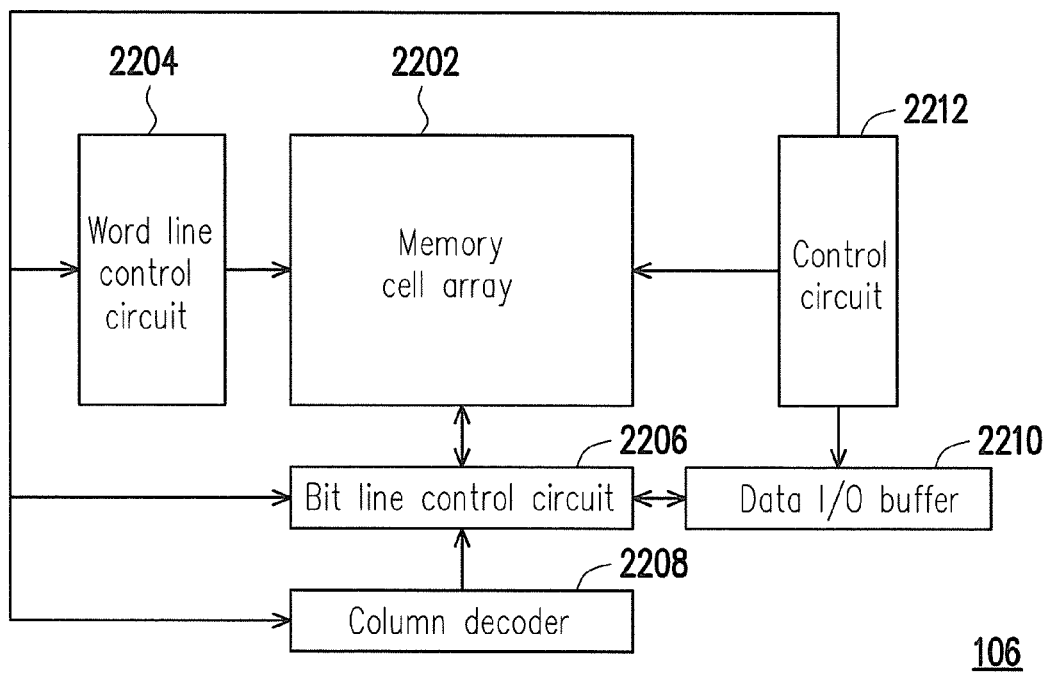
FIG. 6 is a schematic block diagram of a rewritable non-volatile memory module according to an exemplary embodiment.

FIG. 6 is a schematic block diagram of a rewritable non-volatile memory module according to an exemplary embodiment.

Figure 7:
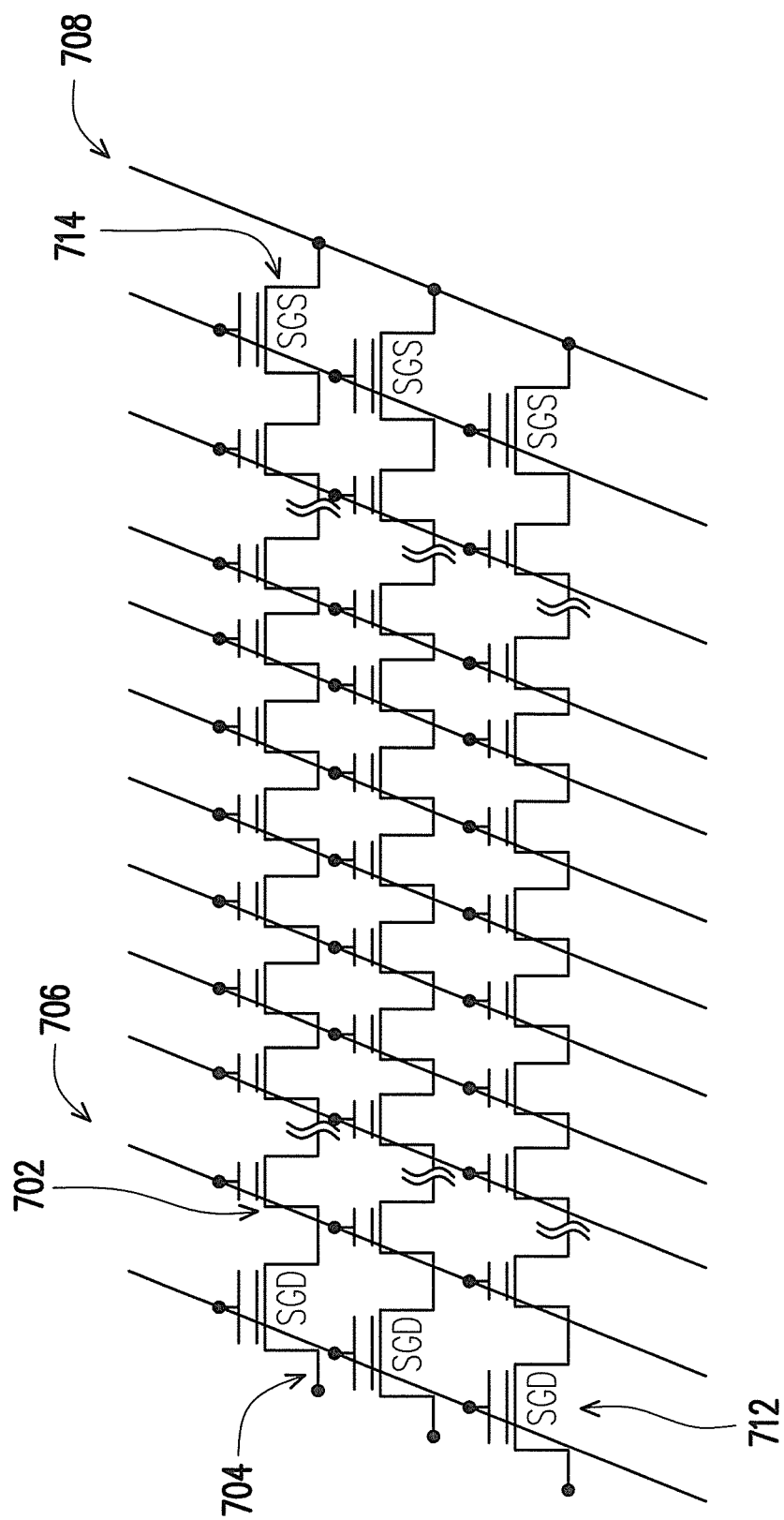
FIG. 7 is a schematic diagram illustrating a memory cell array according to an exemplary embodiment.

With reference to FIG. 6, the rewritable non-volatile memory module 106 includes a memory cell array 2202, a word line control circuit 2204, a bit line control circuit 2206, a column decoder 2208, a data input/output (I/O) buffer 2210, and a control circuit 2212. The memory cell array 2202 includes a plurality of memory cells 702 for storing data, a plurality of select gate drain (SGD) transistors 712, a plurality of select gate source (SGS) transistors 714, a plurality of bit lines 704 for connecting the memory cells, a plurality of word lines 706, and a common source line 708 (as shown in FIG. 7). The memory cells 702 are disposed on the cross points of the bit lines 704 and the word lines 706 as an array. When a write command or a read command is received from the memory controller 104, the control circuit 2212 controls the word line control circuit 2204, the bit line control circuit 2206, the column decoder 2208, and the data I/O buffer 2210 to write data into the memory cell array 2202 or read data from the memory cell array 2202, wherein the word line control circuit 2204 is configured to control the voltage applied to the word lines 706, the bit line control circuit 2206 is configured to control the voltage applied to the bit lines 704, the column decoder 2208 selects the corresponding bit line according to the decoding column address in the command, and the data I/O buffer 2210 is configured to store the data temporarily.

In the present exemplary embodiment, the rewritable non-volatile memory module 106 is an MLC NAND flash memory module which employs a plurality of gate voltages for representing a multi-bit data. To be specific, each memory cell of the memory cell array 2202 has a plurality of states, and the states are distinguished by a plurality of threshold voltages.

Figure 8:
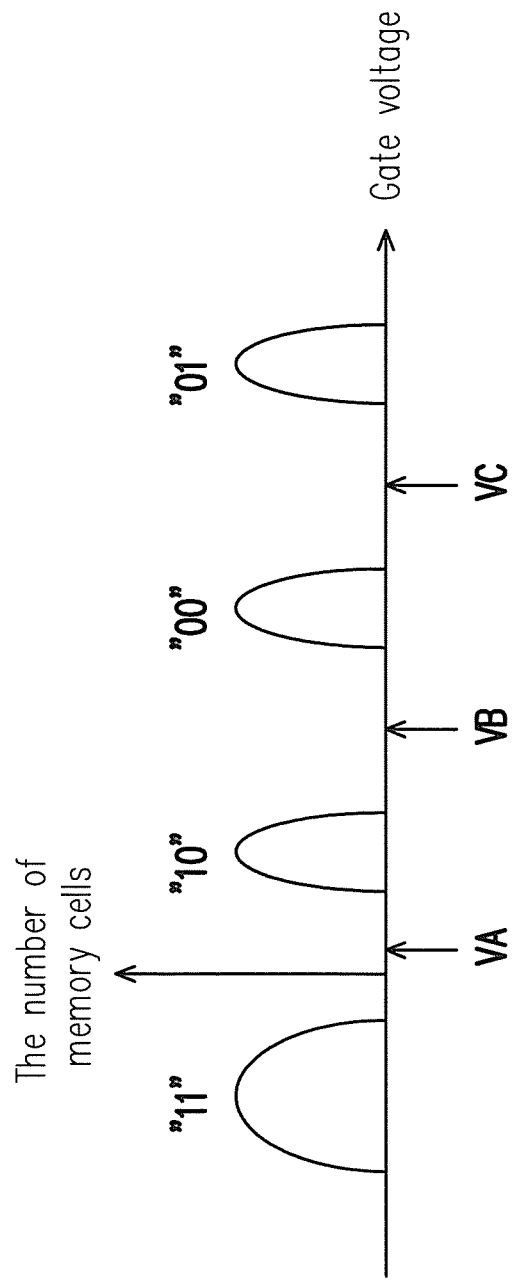
FIG. 8 is a statistical distribution diagram illustrating gate voltages corresponding to data stored in a memory array according to an exemplary embodiment.

FIG. 8 is a statistical distribution diagram illustrating gate voltages corresponding to data stored in a memory array according to an exemplary embodiment.

With reference to FIG. 8, in an exemplary MLC NAND flash memory, the gate voltages in each memory cell may be categorized into 4 storage states according to a first threshold voltage VA, a second threshold voltage VB, and a third threshold voltage VC, and these storage states respectively represent "11", "10", "00", and "01". In other words, each storage state includes the least significant bit (LSB) and the most significant bit (MSB). In the present exemplary embodiment, the first bit from the left of the storage states (i.e., "11", "10", "00", and "01") is the LSB, and the second bit from the left of the storage states is the MSB. Therefore, in the first exemplary embodiment, each memory cell stores 2 bits of data. It should be understood that the gate voltages and the corresponding storage states illustrated in FIG. 8 are only examples. In another exemplary embodiment of the present invention, the gate voltages and the corresponding storage states may also have such an arrangement as "11", "10", "01", and "00" along with the increase in the gate voltages. Alternatively, the storage states corresponding to the gate voltages may also be values obtained by mapping or inverting actual storage values. Besides, in yet another exemplary embodiment, the first bit from the left may be defined as the MSB, and the second bit from the left may be defined as the LSB.

Herein, the first threshold voltage VA, the second threshold voltage VB, and the third threshold voltage VC are defined as a threshold voltage for performing a read operation on a MLC NAND flash memory module. During the memory storage apparatus 100 is manufactured, the first threshold voltage VA, the second threshold voltage VB, and the third threshold voltage VC are set with a set of corresponding initial voltage value (hereinafter referred to as "first read voltage value set"), thereby identifying the storage state of the memory cells.

In the present exemplary embodiment, each memory cell stores 2 bits of data; hence, the memory cells on the same word line constitute a storage space of 2 physical pages (i.e., a lower page and an upper page). Namely, the LSB of each memory cell corresponds to the lower page, and the MSB of each memory cell corresponds to the upper page. In addition, several physical pages in the memory cell array 2202 constitute a physical block, and the physical block is the smallest unit for erasing data. That is to say, each of the physical blocks has a minimum number of memory cells for being erased altogether.

To write (or to program) data to a memory cell of the memory cell array 2202, a voltage (e.g., a gate voltage) applied to a certain terminal in the memory cell is controlled to change the electron volume in a charge-trapping layer in the gate, so that the conduction state of the channel of the memory cell is changed to present a different storage state. For instance, when the data of the lower page is 1, and the data of the upper page is 1 as well, the control circuit 2212 controls the word line control circuit 2204 not to change the gate voltage in the memory cell, so as to keep the storage state of the memory cell as "11". When the data of the lower page is 1, and the data of the upper page is 0, the control circuit 2212 controls the word line control circuit 2204 to change the gate voltage in the memory cell, so as to change the storage state of the memory cell to "10". When the data of the lower page is 0, and the data of the upper page is 0 as well, the control circuit 2212 controls the word line control circuit 2204 to change the gate voltage in the memory cell, so as to change the storage state of the memory cell to "00". When the data of the lower page is 0, and the data of the upper page is 1, the control circuit 2212 controls the word line control circuit 2204 to change the gate voltage in the memory cell, so as to change the storage state of the memory cell to "01".

Figure 9:
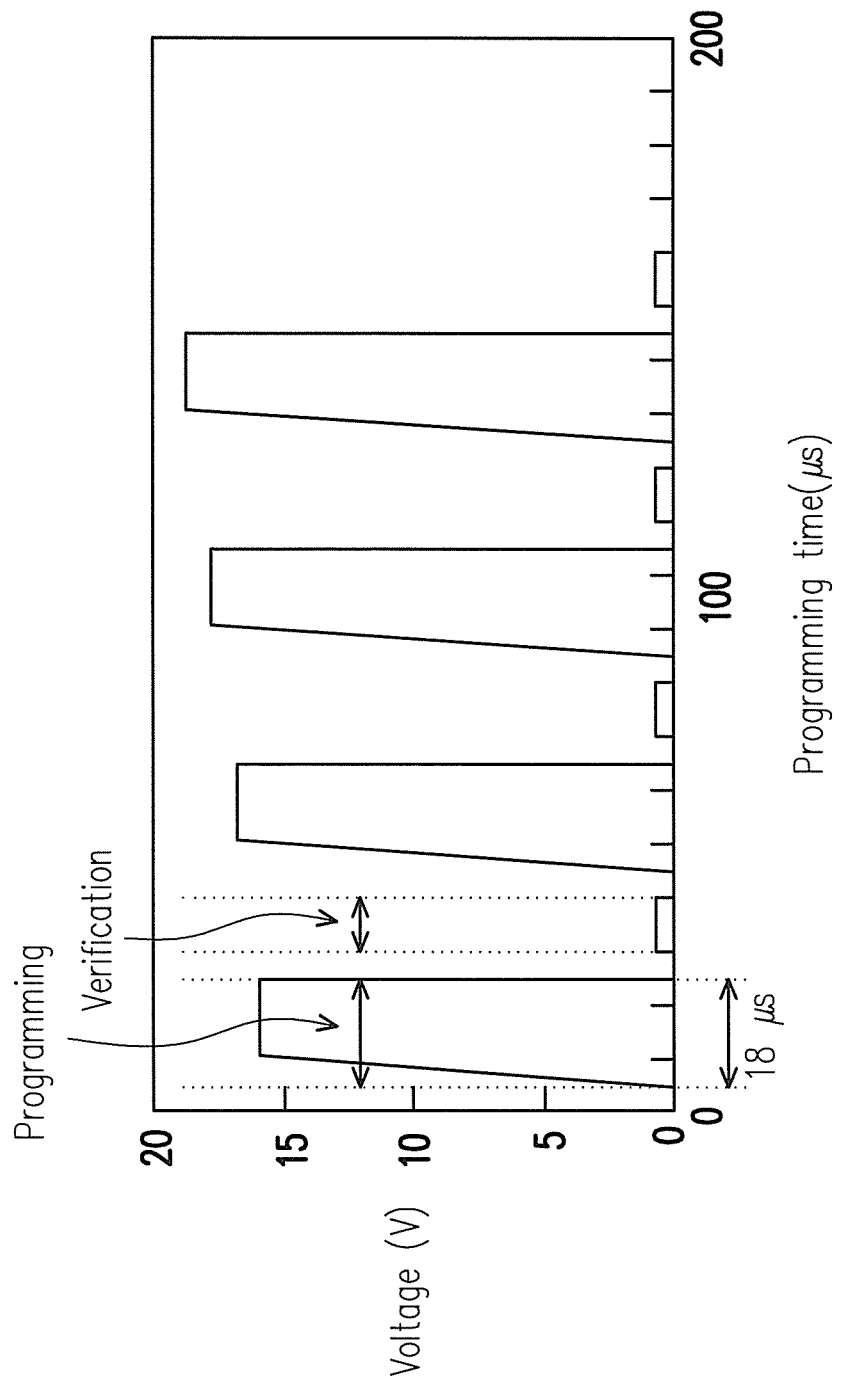
FIG. 9 is a schematic diagram of programming a memory cell according to an exemplary embodiment.

FIG. 9 is a schematic diagram of programming a memory cell according to an exemplary embodiment.

With reference to FIG. 9, in the present exemplary embodiment, the memory cell is programmed through applying a pulse writing/threshold voltage verifying method. Particularly, when data are to be written into the memory cell, the memory controller 104 determines an initial writing voltage and a writing voltage pulse time and instructs the control circuit 2212 of the rewritable non-volatile memory module 106 to program the memory cell according to the determined initial writing voltage and the determined writing voltage pulse time, thereby writing the data into the memory cell. The memory controller 104 then verifies the memory cell by means of a verification voltage, so as to determine whether the memory cell is in the correct storage state. If the memory cell is not programmed to be in the correct storage state, the memory controller 104 instructs the control circuit 2212 to re-program the memory cell according to the determined writing voltage pulse time and a new writing voltage (also referred to as a repetitive writing voltage) obtained by adding an incremental-step-pulse programming (ISPP) adjustment value to the initial writing voltage. By contrast, if the programmed memory cell is in the correct storage state, it indicates that the data are correctly written into the memory cell. For instance, the initial writing voltage is set as 16 voltages (V), the writing voltage pulse time is set as 18 microseconds (μs), and the ISPP adjustment value is set as 0.6 V; however, the present invention is not limited thereto.

Figure 10:
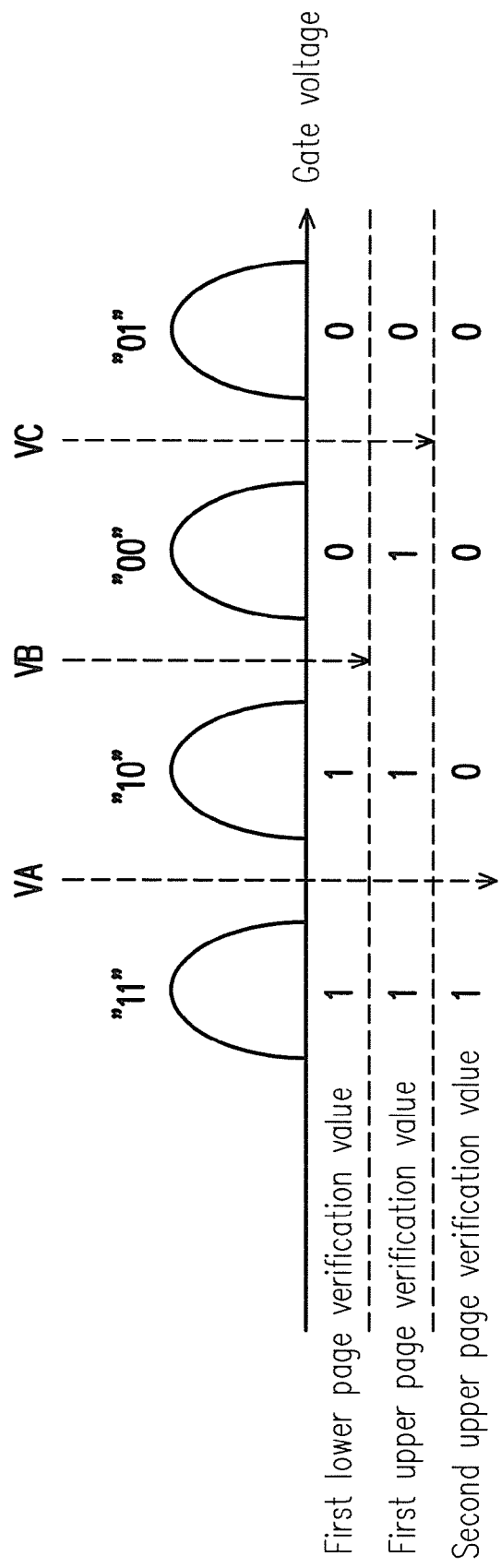
FIG. 10 is a schematic diagram of reading data from a memory cell according to an exemplary embodiment.

FIG. 10 is a schematic diagram of reading data from a memory cell according to an exemplary embodiment.

With reference to FIG. 10, in order to read data from a memory cell of the memory cell array 2202, a voltage for reading data is applied to a control gate; by means of the conduction state of a channel of the memory cell, the data stored in the memory cell may be indicated. Here, the channel of the memory cell refers to an electrical connection path between the bit lines and the source lines of the memory cell (e.g., the path between the source and the drain of the memory cell). In an operation for reading data from a lower page, the word line control circuit 2204 applies the second threshold voltage VB (as the voltage for reading data) to the memory cell and determines the value of data of the lower page according to whether the channel of the memory cell is conducted and the corresponding expression (1):

$$\text{LSB} = (VB)\text{Lower\_pre1} \tag{1}$$

In the expression (1), (VB)Lower_pre1 represents a first lower page verification value obtained by applying the second threshold voltage VB.

For instance, when the second threshold voltage VB is lower than the gate voltage in the memory cell, the channel of the memory cell is not conducted, and a first lower page verification value, which is '0', is output. Accordingly, the LSB is indicated to be in a first state as 0. When the second threshold voltage VB is higher than the gate voltage in the memory cell, the channel of the memory cell is conducted, and the first lower page verification value, which is '1', is output. Accordingly, the LSB is indicated as being in a second state. Here, the first state is indicated as "0," and the second state is indicated as "1". That is, the gate voltage for presenting the LSB as "1" and the gate voltage for presenting the LSB as "0" may be distinguished by the second threshold voltage VB.

In an operation for reading data from an upper page, the word line control circuit 2204 respectively applies the third threshold voltage VC and the first threshold voltage VA (collectively as the voltage for reading data) to the memory cell and determines the value of data of the upper page according to whether the channel of the memory cell is conducted and the corresponding expression (2):

$$\text{MSB} = ((VA)\text{Upper\_pre2}) \text{ xor } (\sim(VC)\text{Upper\_pre1}) \tag{2}$$

In the expression (2), (VC)Upper_pre1 represents a first upper page verification value obtained by applying the third threshold voltage VC, and (VA)Upper_pre2 represents a second upper page verification value obtained by applying the first threshold voltage VA, wherein the symbol "~" represents inversion. Additionally, in the present exemplary embodiment, when the third threshold voltage VC is lower than the gate voltage in the memory cell, the channel of the memory cell is not conducted, and the first upper page verification value ((VC)Upper_pre1), which is '0', is output; when the first threshold voltage VA is lower than the gate voltage in the memory cell, the channel of the memory cell is not conducted, and a second upper page verification value ((VA)Upper_pre2), which is '0', is output.

Thus, in the present exemplary embodiment, according to the expression (2), it is assumed that the third threshold voltage VC and the first threshold voltage VA are both lower than the gate voltage in the memory cell. When the third threshold voltage VC is applied, the channel of the memory cell is not conducted, and a first upper page verification value, which is '0', is output; when the first threshold voltage VA is applied, the channel of the memory cell is not conducted, and a second upper page verification value, which is '0', is output. At this time, the MSB is indicated as being in the second state, i.e., "1".

For instance, it is assumed that the third threshold voltage VC is higher than the gate voltage of the memory cell, and the first threshold voltage VA is lower than the gate voltage of the memory cell. When the third threshold voltage VC is applied, the channel of the memory cell is conducted, and a first upper page verification value, which is '1', is output; when the first threshold voltage VA is applied, the channel of the memory cell is not conducted, and a second upper page verification value, which is '0', is output. At this time, the MSB is indicated as being in a first state, i.e., "0".

For instance, it is assumed that the third threshold voltage VC and the first threshold voltage VA are both higher than the gate voltage of the memory cell. When the third threshold voltage VC is applied, the channel of the memory cell is conducted, and a first upper page verification value, which is '1', is output; when the first threshold voltage VA is applied, the channel of the memory cell is conducted, and a second upper page verification value, which is '1', is output. At this time, the MSB is indicated as being in the second state, i.e., "1".

It should be understood that the exemplary MLC NAND flash memory described herein should not be construed as limitation to the present invention, and data can be read from any other MLC NAND flash memory through the principle described above.

Figure 11:
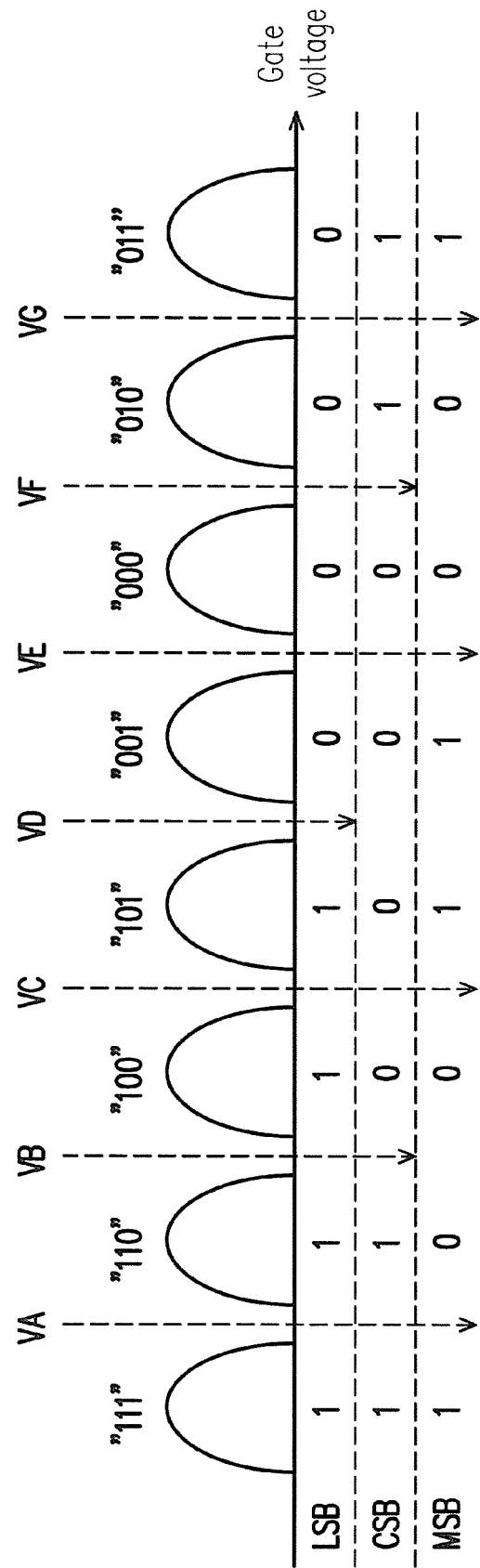
FIG. 11 is a schematic diagram of reading data from a memory cell according to another exemplary embodiment.

For instance, in an exemplary TLC NAND flash memory (as shown in FIG. 11), each storage state includes an LSB (the first bit from the left), a center significant bit (CSB, the second bit from the left), and an MSB (the third bit from the left), wherein the LSB corresponds to a lower page, the CSB corresponds to a center page, and the MSB corresponds to an upper page. In this example, the gate voltage in each memory cell is distinguished into 8 storage states (i.e., "111", "110", "100", "101", "001", "000", "010", and "011") according to a first threshold voltage VA, a second threshold voltage VB, a third threshold voltage VC, a fourth threshold voltage VD, a fifth threshold voltage VE, a sixth threshold voltage VF, and a seventh threshold voltage VG.

Figure 12:
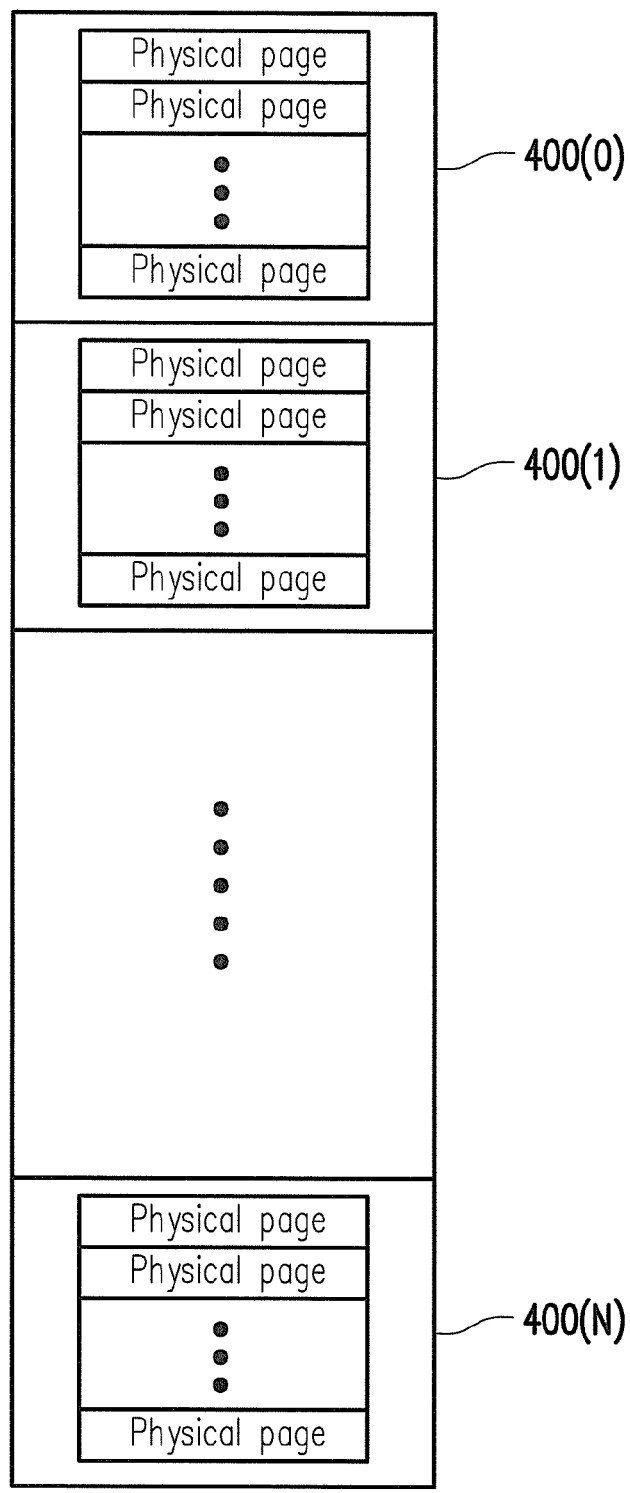
FIG. 12 is a schematic diagram of managing a rewritable non-volatile memory module according to an exemplary embodiment of the present invention.

FIG. 12 is a schematic diagram of managing a rewritable non-volatile memory module according to an exemplary embodiment of the present invention.

With reference to FIG. 12, the memory controller 104 (or the memory management circuit 202) writes data into the memory cells 702 of the rewritable non-volatile memory module 106 in units of each physical page and erases data from the memory cells 702 of the rewritable non-volatile memory module 106 in units of each physical block. Particularly, the memory cells 702 in the rewritable non-volatile memory module 106 constitute a plurality of physical pages, and the physical pages constitute a plurality of physical blocks 400(0)-400(N). Each physical block is the smallest erasing unit. Namely, each physical block contains the least number of memory cells which are erased all together. Each physical page is the smallest unit for programming data. Namely, each physical page is the smallest unit for writing data. Each physical page usually includes a data bit area and a redundant bit area. The data bit area includes a plurality of physical access address for storing user data, and the redundant bit area is used for storing system data (e.g., error checking and correcting (ECC) codes). In the present exemplary embodiment, the LSBs of the memory cells on the same word line constitute a lower physical page; the CSBs of the memory cells on the same word line constitute a center physical page; the MSBs of the memory cells on the same word line constitute an upper physical page.

Figure 13:
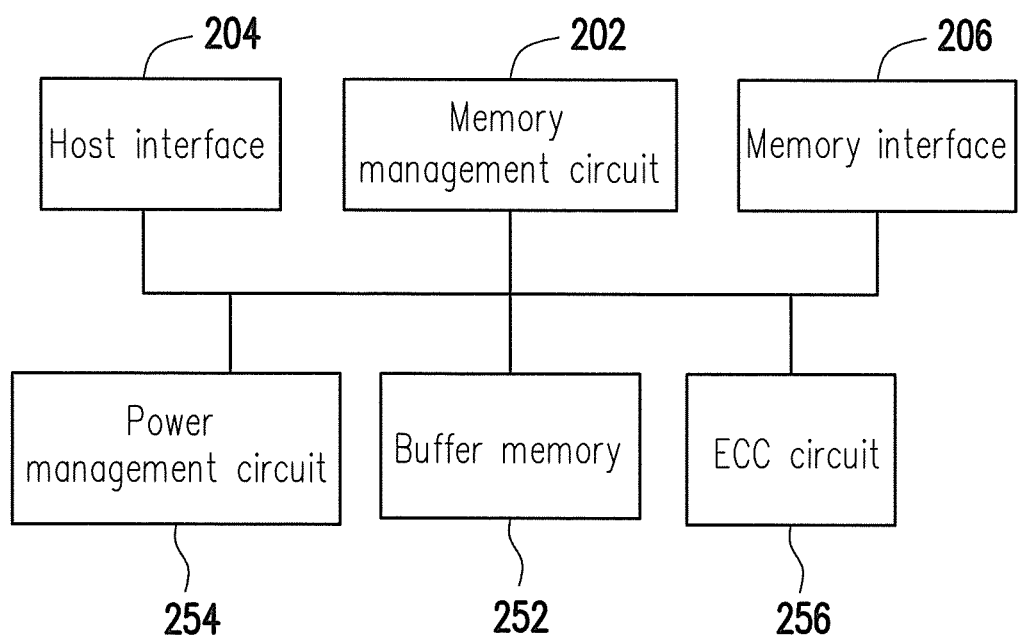
FIG. 13 is a schematic block diagram illustrating a memory controller according to an exemplary embodiment.

FIG. 13 is a schematic block diagram illustrating a memory controller according to an exemplary embodiment. It should be understood that the memory controller depicted in FIG. 13 is merely exemplary and should not be construed as a limitation to the present invention.

With reference to FIG. 13, the memory controller 104 includes a memory management circuit 202, a host interface 204, and a memory interface 206.

The memory managing circuit 202 is configured to control the whole operation of the memory controller 104. Particularly, the memory management circuit 202 has a plurality of control instructions; when the memory storage apparatus 100 is operated, the control instructions are executed to perform a data writing operation, a data reading operation, a data erasing operation, and so on.

In the present exemplary embodiment, the control instructions of the memory managing circuit 202 are implemented in a firmware form. For example, the memory managing circuit 202 includes a microprocessor unit (not shown) and a read-only memory (ROM, not shown), wherein the control instructions are burnt in the read-only memory. When the memory storage apparatus 100 is operated, the control instructions are executed by a microprocessor unit to write, read, and erase data.

In another exemplary embodiment of the present invention, the control commands of the memory management circuit 202 may also be stored in a specific block (for example, a system block in a memory module exclusively used for storing system data) of the rewritable non-volatile memory module 106 as a programming code. Moreover, the memory management circuit 202 includes a microprocessor unit (not shown), a read-only memory (ROM, not shown) and a random access memory (not shown). In particular, the ROM has a boot code, and when the memory controller 104 is enabled, the microprocessor unit first executes the boot code to load the control instructions from the rewritable non-volatile memory module 106 into the RAM of the memory management circuit 202. The microprocessor unit then executes the control instructions to write, read, and erase data.

Furthermore, as in another exemplary embodiment, the control instructions in the memory management circuit 202 are implemented in a hardware form. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage physical blocks of the rewritable non-volatile memory module 106. The memory writing circuit is configured to issue a write command to the rewritable non-volatile memory module 106 for writing data thereto. The memory reading circuit is configured to issue a read command to the rewritable non-volatile memory module 106 for reading data therefrom. The memory erasing circuit is configured to issue an erase command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is coupled to the memory management circuit 202 and configured to receive and identify the commands and the data transmitted by the host system 1000. Namely, the commands and data transmitted by the host system 1000 are passed to the memory management circuit 202 through the host interface 204. In the present exemplary embodiment, the host interface 204 complies with the USB standard. However, it should be understood that the present invention is not limited thereto, and the host interface 204 may comply with the PATA standard, the IEEE 1394 standard, the PCI express standard, the SD standard, the SATA standard, the UHS-I interface standard, the UHS-II interface standard, the MS standard, the MMC standard, the eMMC interface standard, the UFS interface standard, the CF standard, the IDE standard, or other suitable data transmission standards.

The memory interface 206 is coupled to the memory management circuit 202 for accessing the rewritable non-volatile memory module 106. In other words, the data to be written into the rewritable non-volatile memory module 106 is converted to an acceptable format for the rewritable non-volatile memory module 106 by the memory interface 206.

In an exemplary embodiment of the present invention, the memory controller 104 further includes a buffer memory 252, a power management circuit 254, and an error checking and correcting (ECC) circuit 256.

The buffer memory 252 is coupled to the memory management circuit 202 and configured to temporarily store the data and commands from the host system 1000 or the data from the rewritable non-volatile memory module 106.

The power managing circuit 254 is coupled to the memory management circuit 202 and configured to control the power of the memory storage apparatus 100.

The error checking and correcting circuit 256 is coupled to the memory management circuit 202 and configured to perform an error checking and correcting procedure to assure the accuracy of data.

In the present exemplary embodiment, when the memory management circuit 202 receives a write command from the host system 1000, the ECC circuit 256 generates an ECC code for data corresponding to the write command, and the memory management circuit 202 writes the data corresponding to the write command and the corresponding ECC code into the rewritable non-volatile memory module 106. Thereafter, when reading the data from the rewritable non-volatile memory module 106, the memory management circuit 202 simultaneously reads the corresponding ECC code, and the ECC circuit 256 executes the ECC procedure on the read data according to the corresponding ECC code. In particular, the ECC circuit 256 is configured to be capable of correcting a certain number of error bits (which is referred to as the maximum correctable error bit amount hereinafter). For instance, the maximum correctable error bit amount is 24. If the number of the error bits in the read data is equal to or less than 24, the ECC circuit 256 corrects the error bits back to the correct and accurate values according to the ECC code. Otherwise, the ECC circuit 256 reports a failure of error correcting, and the memory management circuit 202 transmits a message indicating data loss to the host system 1000.

Figure 14:
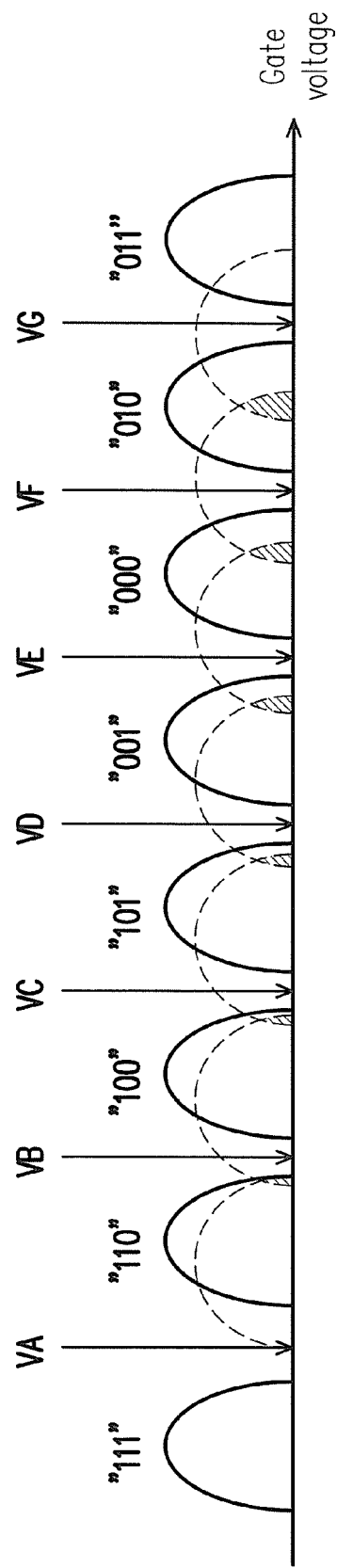
FIG. 14 is a statistical distribution diagram illustrating gate voltages corresponding to data stored in a memory array after the memory cells of the memory array are programmed and erased for many times according to an exemplary embodiment.

As described above, when reading data from memory cells, the memory controller 104 (or the memory management circuit 202) indicates the control circuit 2212 of the rewriteable non-volatile module 106 to apply the set read voltage set to a word line connected to the memory cells to be read, thereby verify the conduction state of the channels of the memory cells. In particular, during writing and erasing operations, a part of the structure (e.g., tunnel oxide layer) of the memory cells 702 in the flash memory device 106 deteriorates due to the frequent injection and removal of the electrons, thus increasing the speed of writing the electrons and extending the distribution of the threshold voltage (as the dotted lines shown in FIG. 14). Therefore, the threshold voltage set which is set with the first read voltage value set may not be used for correctly identifying the storage state of the memory cells. In order to solve the problem, in the exemplary embodiment, when the number of error bits occurred in data read from a physical page exceeds a predetermined threshold, the memory controller 104 (or the memory management circuit 202) applies a single test voltage to a corresponding word line to obtain information about data retention capability of the memory cells and adjusts the threshold voltage set based on the information. Herein, the predetermined threshold may be smaller than or equal to the maximum correctable error bit amount. To be specific, in a case where the predetermined threshold is set to be equal to the maximum correctable error bit amount, if the number of error bits occurred in data read from a physical page exceeds the predetermined threshold, it means that the read data is not correctable. However, in a case where the predetermined threshold is set to be smaller than the maximum correctable error bit amount, if the number of error bits occurred in data read from a physical page exceeds the predetermined threshold, it means that there are many error bits occurred in data read, but the read data may still be correctable.

To be specific, when reading data from a physical page (hereinafter referred to as the first physical page), the memory controller 104 (or the memory management circuit 202) reads a corresponding ECC code from the first physical page and the memory controller 104 (or the error checking and correcting circuit 256) performs the error checking and correcting procedure to determines whether any error bit occurs in the read data based on the corresponding ECC code and, if there are error bits in the read data, tries to correct the error bits. In particular, if the number of error bits is larger than the predetermined threshold, the memory controller 104 (or the memory management circuit 202) applies a single test voltage to a word line connected to the memory cells constituting the first physical page, so as to read a plurality of verification bit data from the memory cells. That is, the single test voltage is served as a read voltage for applying to control gates and bit data stored in the memory cells is identified according the conduction state of the channels of the memory cells.

For example, in a case where the rewritable non-volatile memory module 106 is a MLC NAND flash memory module, the single test voltage is between a voltage value set as the first threshold voltage VA and a voltage value set as the third threshold voltage VC in the first read voltage value set. For example, in a case where the rewritable non-volatile memory module 106 is a TLC NAND flash memory module, the single test voltage is between a voltage value set as the first threshold voltage VA and a voltage value set as the seventh threshold voltage VG in the first read voltage value set.

After obtaining the verification bit data, the memory controller 104 (or the memory management circuit 202) calculates a variation of bit data identified as the first state among the verification bit data. To be specific, during the manufacture of the memory storage apparatus 100, the memory controller 104 (or the memory management circuit 202) programs test data into the memory cells, applies the single test voltage to a word line to read a plurality of initial verification bit data and calculates an amount of bit data identified as the first state among the initial verification bit data. In particular, information about the amount of bit data identified as the first state among the initial verification bit data is recorded and then after obtaining the verification bit data, the memory controller 104 (or the memory management circuit 202) calculates an amount of bit data identified as the first state among the verification bit data and obtains the increment or the decrement of bit data identified as the first state among the verification bit data by subtracting the amount of bit data identified as the first state among the initial verification bit data from the amount of bit data identified as the first state among the verification bit data.

In this exemplary embodiment, the memory controller 104 (or the memory management circuit 202) looks up a read voltage corresponding table to obtain new read voltage value set (hereinafter referred to as second read voltage value set) and sets the threshold voltage set for reading the first physical page with the second read threshold value set. Particularly, appropriate read voltage values corresponding to various distribution of the threshold voltage of the rewritable non-volatile memory module 106 are obtained by a simulation technology and recorded in the read voltage corresponding table. For example, a function for estimating a shift of the threshold voltage of the rewritable non-volatile memory module 106 may be built according to an amount of memory cells identified as the first state among the memory cells of the rewritable non-volatile memory module 106, the eras counts of the memory cells or other information indicating the wear degree of the memory cells and appropriate read voltage values corresponding to the shift may be calculated and recorded in the read voltage corresponding table. During the manufacture of the memory storage apparatus 100, the read voltage corresponding table is loaded into the rewritable non-volatile memory module 106 or other non-volatile storage circuit within the memory controller 104. Because the change degree of the distribution of the threshold voltage may be identified based on the increment (or the decrement) of bit data identified as the first state among the bit data stored in the memory cells, in the present exemplary embodiment, the memory controller 104 (or the memory management circuit 202) obtains more appropriate read voltage value set as a threshold voltage set for reading data from the read threshold corresponding table according to the increment of bit data identified as the first state. It should be mentioned that appropriate read voltage value set is obtained by looking up the read voltage corresponding table in the present exemplary embodiment, but the present invention is not limited thereto. In another exemplary embodiment, the memory controller 104 (or the memory management circuit 202) may calculates appropriate read voltage value set by a predetermined function according to the variation of bit data identified as the first state.

In particularly, in another exemplary embodiment, if the number of error bits occurred in data read from the first physical page by using the second read voltage value set is larger than the predetermined threshold, the memory controller 104 (or the memory management circuit 202) adjusts the second read voltage value set based on a margin to obtain an adjusted read voltage value set (hereinafter referred to as "the third read voltage value set") and executes a retry read operation to the first physical page with the threshold voltage set updated with the third read voltage value set.

Figure 15:
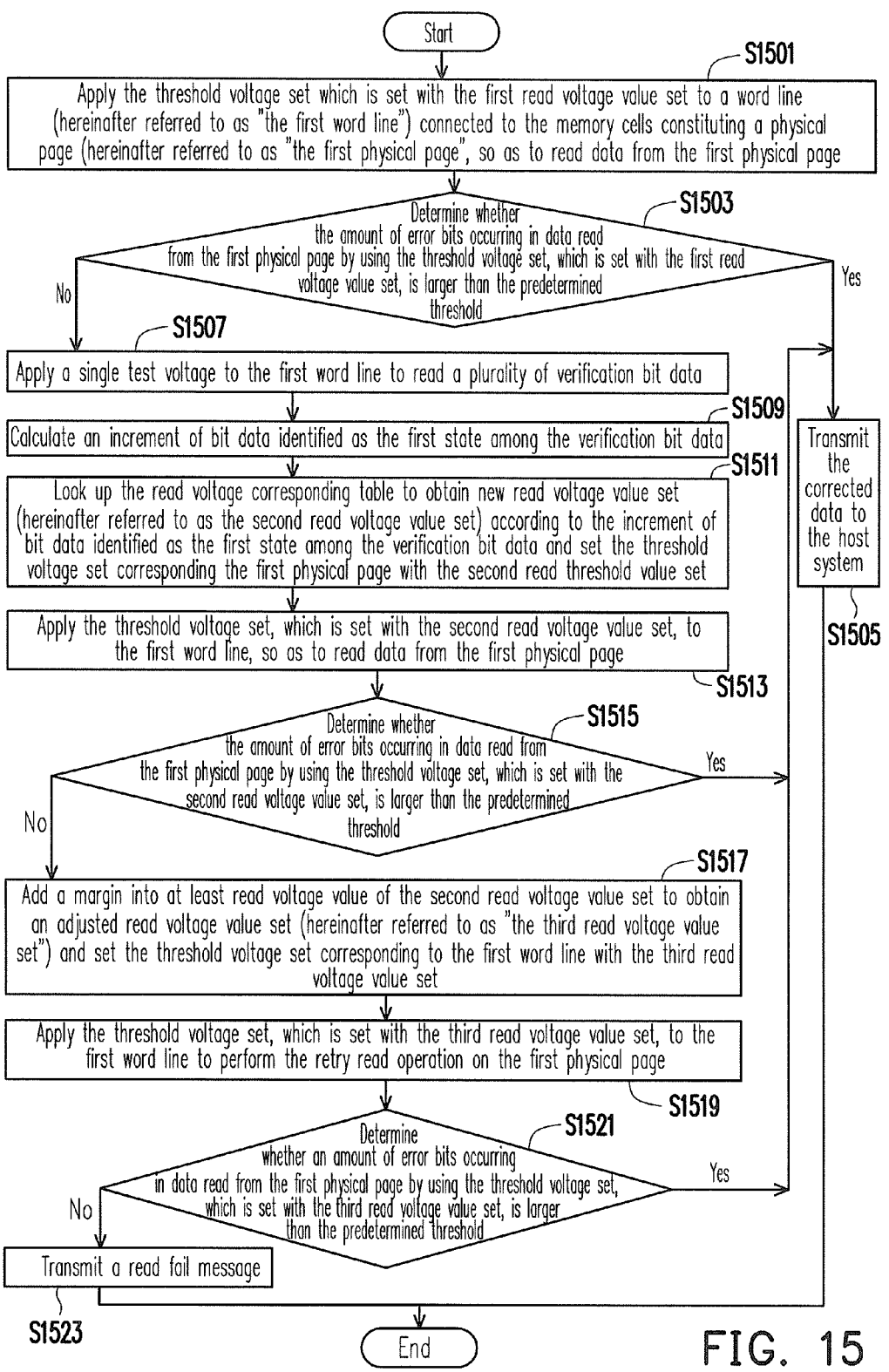
FIG. 15 is a flowchart illustrating a data reading method according to an exemplary embodiment of the present invention.

FIG. 15 is a flowchart illustrating a data reading method according to an exemplary embodiment of the present invention.

Referring to FIG. 15, in Step S1501, the memory controller 104 (or the memory management circuit 202) applies the threshold voltage set which is set with the first read voltage value set to a word line (hereinafter referred to as "the first word line") connected to the memory cells constituting a physical page (hereinafter referred to as "the first physical page", so as to read data from the first physical page. For example, the memory controller 104 (or the memory management circuit 202) read data from the first physical page in response to a read command received from the host system 1000 or read data to be moved from the first physical page for performing a data merge operation.

In Step S1503, the memory controller 104 (or the memory management circuit 202) determines whether the amount of error bits occurring in data read from the first physical page by using the threshold voltage set, which is set with the first read voltage value set, is larger than the predetermined threshold.

If the amount of error bits occurring in data read from the first physical page by using the threshold voltage set which is set with the first read voltage value set is not larger than the predetermined threshold, in step S1505 the memory controller 104 (or the memory management circuit 202) transmits the corrected data to the host system 1000.

If the amount of error bits occurring in data read from the first physical page by using the threshold voltage set which is set with the first read voltage value set is larger than the predetermined threshold, in step S1507, the memory controller 104 (or the memory management circuit 202) applies a single test voltage to the first word line to read a plurality of verification bit data, and in step S1509, the memory controller 104 (or the memory management circuit 202) calculates a variation of bit data identified as the first state among the verification bit data. The example of calculating the increment of bit data identified as the first state among the verification bit data is described above, and no relevant descriptions are given herein.

Then, in step S1511, the memory controller 104 (or the memory management circuit 202) looks up the read voltage corresponding table to obtain new read voltage value set (hereinafter referred to as the second read voltage value set) according to the increment of bit data identified as the first state among the verification bit data and sets the threshold voltage set corresponding the first physical page with the second read threshold value set.

And, in step S1513, the memory controller 104 (or the memory management circuit 202) applies the threshold voltage set, which is set with the second read voltage value set, to the first word line, so as to read data from the first physical page. And, in step S1515, the memory controller 104 (or the memory management circuit 202) determines whether the amount of error bits occurring in data read from the first physical page by using the threshold voltage set, which is set with the second read voltage value set, is larger than the predetermined threshold.

If the amount of error bits occurring in data read from the first physical page by using the threshold voltage set which is set with the second read voltage value set is not larger than the predetermined threshold, step S1505 is performed.

If the amount of error bits occurring in data read from the first physical page by using the threshold voltage set which is set with the second read voltage value set is larger than the predetermined threshold, in step S1517, the memory controller 104 (or the memory management circuit 202) adds a margin into at least read voltage value of the second read voltage value set to obtain an adjusted read voltage value set (hereinafter referred to as "the third read voltage value set") and sets the threshold voltage set corresponding to the first word line with the third read voltage value set.

Then, in step S1519, the memory controller 104 (or the memory management circuit 202) applies the threshold voltage set, which is set with the third read voltage value set, to the first word line to perform the retry read operation on the first physical page.

After that, in step S1521, the memory controller 104 (or the memory management circuit 202) determines whether an amount of error bits occurring in data read from the first physical page by using the threshold voltage set, which is set with the third read voltage value set, is larger than the predetermined threshold.

If the amount of error bits occurring in data read from the first physical page by using the threshold voltage set which is set with the third read voltage value set is not larger than the predetermined threshold, step S1505 is performed.

If the amount of error bits occurring in data read from the first physical page by using the threshold voltage set which is set with the third read voltage value set is larger than the predetermined threshold, in step S1523, the memory controller 104 (or the memory management circuit 202) transmits a read fail message to the host system 1000.

It should be noted that in the present exemplary embodiment, when the read operation is performed and the number of error bits occurred in data read from a physical page exceeds the predetermined threshold, the memory controller 104 (or the memory management circuit 202) applies a single test voltage to a corresponding word line to read a plurality of verification bit data and adjusts the read voltage according to the increment of bit data identified as the first state. However, the present invention is not limited thereto, and in another exemplary embodiment, the memory controller 104 (or memory management circuit 202) may record an erase count of the rewritable non-volatile memory module 106 and when the erase count of the rewritable non-volatile memory module 106 is larger than an erase count threshold, the read voltage adjustment operation described above is executed. To be specific, the memory controller 104 (or the memory management circuit 202) records an erase count, and every when the erasing operation is performed on the physical blocks, the memory controller 104 (or the memory management circuit 202) adds the erase count by 1. And, when the erase count is larger than the erase count threshold, it represents the memory cells has worn and the memory controller 104 (or the memory management circuit 202) performs the read voltage adjustment operation of the exemplary embodiment described above to correctly identify the storage state of the memory cells.

It should be mentioned that even though the memory management circuit 202 is implemented within the memory controller 104 in the present exemplary embodiment, the present invention is not limited thereto. In another exemplary embodiment, the memory management circuit 202 may be implemented within the control circuit of the rewritable non-volatile memory module 106 and is electrically connected to the memory array 2202 of the rewritable non-volatile memory module 106.

In view of the above, the data reading method, the control circuit, the rewritable non-volatile memory module and the memory storage apparatus of the exemplary embodiments of the present invention can adjust dynamically the read voltage according to the wear degree of the memory cells, thereby preventing data stored in the memory cells from losing. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A memory read method for a rewritable non-volatile memory module, wherein the rewritable non-volatile memory module has a plurality of memory cells, a plurality of word lines and a plurality of bit lines, each of the memory cells electrically connected to one of the word lines and one of the bit lines, each of the memory cells stores at least one bit data, each of the bit data is identified as a first state or a second state according to a voltage, and the memory cells constitute a plurality of physical pages, the memory read method comprising:
    applying a test voltage to a first word line among the word lines to read a plurality of verification bit data, wherein a threshold voltage set is set with a first read voltage value set and assigned to the first word line;
    calculating a variation of bit data identified as the first state among the verification bit data;
    obtaining a second read voltage value set according to the variation;
    updating the threshold voltage set with the second read voltage value set; and
    using the threshold voltage set updated with the second read voltage value set to read data from a first physical page among the physical pages, wherein memory cells constituting the first physical page among the memory cells are electrically connected to the first word line.

2. The data reading method according to claim 1, further comprising:
    programming test data into the memory cells connected by the first word line and applying the test voltage to the first word line to read a plurality of initial verification bit data; and
    calculating an amount of bit data identified as the first state among the initial verification bit data.

3. The data reading method according to claim 2, wherein the step of calculating the variation of bit data identified as the first state among the verification bit data comprises:
    calculating an amount of bit data identified as the first state among the verification bit data; and
    obtaining the variation by subtracting the amount of bit data identified as the first state among the initial verification bit data from the amount of bit data identified as the first state among the verification bit data.

4. The data reading method according to claim 1, further comprising:
    determining whether an amount of error bits occurring in data read from the first physical page by using the threshold voltage set updated with the second read voltage value set is larger than a predetermined threshold;
    using a margin to adjust the second read voltage value set to generate a third read voltage value set and updating the threshold voltage set with the third read voltage value set if the amount of error bits occurring in the data read from the first physical page by using the threshold voltage set updated with the second read voltage value set is larger than the predetermined threshold; and
    performing a retry read on the first physical page by using the threshold voltage set updated with the third read voltage value set.

5. The data reading method according to claim 1, wherein the first read voltage value set includes a plurality of read voltage values and a value of the test voltage is equal to a maximum read voltage value among the read voltage values or between the maximum read voltage value and a second largest read voltage value among the read voltage values.

6. The data reading method according to claim 1, further comprising:
reading data from the first physical page by using the threshold voltage set with the first read voltage value set;
determining whether an amount of error bits occurring in the data read from the first physical page by using the threshold voltage set with the first read voltage value set is larger than a predetermined threshold;
wherein the step of applying the test voltage to the first word line to read the plurality of verification bit data is performed if the amount of error bits occurring in the data read from the first physical page by using the threshold voltage set with the first read voltage value set is larger than the predetermined threshold.

7. The data reading method according to claim 1, further comprising:
determining whether an erase count of the rewritable non-volatile memory module is larger than an erase count threshold,
wherein the step of applying the test voltage to the first word line to read the plurality of verification bit data is performed if the erase count of the rewritable non-volatile memory module is larger than the erase count threshold.

8. The data reading method according to claim 1, wherein the step of obtaining the second read voltage value set according to the variation comprises:
looking up a read voltage corresponding table according to the variation to obtain the second read voltage value set.

9. A memory controller for reading data from a plurality of memory cells of a rewritable non-volatile memory module, the control comprising:
an interface configured to electrically connected to the memory cells, a plurality of word lines and a plurality of bit lines, wherein each of the memory cells electrically connected to one of the word lines and one of the bit lines, each of the memory cells stores at least one bit data, each of the bit data is identified as a first state or a second state according to a voltage and the memory cells constitute a plurality of physical pages; and
a memory management circuit coupled to the interface and configured to apply a test voltage to a first word line among the word lines to read a plurality of verification bit data, wherein the memory management circuit set a first read voltage value set as a threshold voltage set for the first word line,
wherein the memory management circuit is further configured to calculate a variation of bit data identified as the first state among the verification bit data and obtain a second read voltage value set based on the variation,
wherein the memory management circuit is further configured to update the threshold voltage set with the second read voltage value set and read data from a first physical page among the physical pages by using the threshold voltage set updated with the second read voltage value set, wherein memory cells constituting the first physical page among the memory cells are electrically connected to the first word line.

10. The control circuit according to claim 9, wherein the memory management circuit is further configured to program test data into the memory cells connected by the first word line and apply the test voltage to the first word line to read a plurality of initial verification bit data,
wherein the memory management circuit is further configured to calculate an amount of bit data identified as the first state among the initial verification bit data.

11. The control circuit according to claim 10, wherein in the operation of calculating the variation of bit data identified as the first state among the verification bit data, the memory management circuit calculates an amount of bit data identified as the first state among the verification bit data and obtains the variation by subtracting the amount of bit data identified as the first state among the initial verification bit data from the amount of bit data identified as the first state among the verification bit data.

12. The control circuit according to claim 9, wherein the memory management circuit is further configured to determine whether an amount of error bits occurring in data read from the first physical page by using the threshold voltage set updated with the second read voltage value set is larger than a predetermined threshold,
if the amount of error bits occurring in the data read from the first physical page by using the threshold voltage set updated with the second read voltage value set is larger than the predetermined threshold, the memory management circuit uses a margin to adjust the second read voltage value set to generate a third read voltage value set, updates the threshold voltage set with the third read voltage value set and performs a retry read on the first physical page by using the threshold voltage set updated with the third read voltage value set.

13. The control circuit according to claim 9, wherein the first read voltage value set includes a plurality of read voltage values, and a value of the test voltage is equal to a maximum read voltage value among the read voltage values or between the maximum read voltage value and a second largest read voltage value among the read voltage values.

14. The control circuit according to claim 9, wherein the memory management circuit is further configured to read data from the first physical page by using the threshold voltage set with the first read voltage value set and determine whether an amount of error bits occurring in the data read from the first physical page by using the threshold voltage set with the first read voltage value set is larger than a predetermined threshold,
wherein the memory management circuit applies the test voltage to the first word line to read the plurality of verification bit data if the amount of error bits occurring in the data read from the first physical page by using the threshold voltage set with the first read voltage value set is larger than the predetermined threshold.

15. The control circuit according to claim 9, wherein the memory management circuit is further configured to determine whether an erase count of the rewritable non-volatile memory module is larger than an erase count threshold,
wherein the memory management circuit applies the test voltage to the first word line to read the plurality of verification bit data if the erase count of the rewritable non-volatile memory module is larger than the erase count threshold.

16. The control circuit according to claim 9, wherein in the operation of obtaining the second read voltage value set according to the variation, the memory management circuit looks up a read voltage corresponding table according to the variation to obtain the second read voltage value set.

17. A memory storage apparatus, comprising:
a connector configured to couple to a host system;
a rewritable non-volatile memory module, wherein the rewritable non-volatile memory module has a plurality of memory cells, a plurality of word lines and a plurality of bit lines, each of the memory cells electrically connected to one of the word lines and one of the bit lines, each of the memory cells stores at least one bit data, each of the bit data is identified as a first state or a second state according to a voltage and the memory cells constitute a plurality of physical pages; and a memory controller coupled to the connector and the rewritable non-volatile memory module, wherein the memory controller is configured to apply a test voltage to a first word line among the word lines to read a plurality of verification bit data, wherein the memory controller sets a first read voltage value set as a threshold voltage set for the first word line, wherein the memory controller is further configured to calculate a variation of bit data identified as the first state among the verification bit data and obtain a second read voltage value set based on the variation, wherein the memory controller is further configured to update the threshold voltage set with the second read voltage value set and read data from a first physical page among the physical pages by using the threshold voltage set updated with the second read voltage value set, wherein memory cells constituting the first physical page among the memory cells are electrically connected to the first word line.

18. The memory storage apparatus according to claim 17, wherein the memory controller is further configured to program test data into the memory cells connected by the first word line and apply the test voltage to the first word line to read a plurality of initial verification bit data, wherein the memory controller is further configured to calculate an amount of bit data identified as the first state among the initial verification bit data.

19. The memory storage apparatus according to claim 18, wherein in the operation of calculating the variation of bit data identified as the first state among the verification bit data, the memory controller calculates an amount of bit data identified as the first state among the verification bit data and obtains the variation by subtracting the amount of bit data identified as the first state among the initial verification bit data from the amount of bit data identified as the first state among the verification bit data.

20. The memory storage apparatus according to claim 17, wherein the memory controller is further configured to determine whether an amount of error bits occurring in data read from the first physical page by using the threshold voltage set updated with the second read voltage value set is larger than a predetermined threshold, if the amount of error bits occurring in the data read from the first physical page by using the threshold voltage set updated with the second read voltage value set is larger than the predetermined threshold, the memory controller uses a margin to adjust the second read voltage value set to generate a third read voltage value set, updates the threshold voltage set with the third read voltage value set and performs a retry read on the first physical page by using the threshold voltage set updated with the third read voltage value set.

21. The memory storage apparatus according to claim 17, wherein the first read voltage value set includes a plurality of read voltage values, and a value of the test voltage is equal to a maximum read voltage value among the read voltage values or between the maximum read voltage value and a second largest read voltage value among the read voltage values.

22. The memory storage apparatus according to claim 17, wherein the memory controller is further configured to read data from the first physical page by using the threshold voltage set with the first read voltage value set and determine whether an amount of error bits occurring in the data read from the first physical page by using the threshold voltage set with the first read voltage value set is larger than a predetermined threshold, wherein the memory controller applies the test voltage to the first word line to read the plurality of verification bit data if the amount of error bits occurring in the data read from the first physical page by using the threshold voltage set with the first read voltage value set is larger than the predetermined threshold.

23. The memory storage apparatus according to claim 17, wherein the memory controller is further configured to determine whether an erase count of the rewritable non-volatile memory module is larger than an erase count threshold, wherein the memory controller applies the test voltage to the first word line to read the plurality of verification bit data if the erase count of the rewritable non-volatile memory module is larger than the erase count threshold.

24. The memory storage apparatus according to claim 17, wherein in the operation of obtaining the second read voltage value set according to the variation, the memory controller looks up a read voltage corresponding table according to the variation to obtain the second read voltage value set.

25. A memory module, comprising:
a plurality of word lines;
a plurality of bit lines;
a plurality of memory cells, wherein each of the memory cells electrically connected to one of the word lines and one of the bit lines, each of the memory cells stores at least one bit data, each of the bit data is identified as a first state or a second state according to a voltage and the memory cells constitute a plurality of physical pages; and a control circuit coupled to the word lines, the bit lines and the memory cells, wherein the control circuit is configured to apply a test voltage to a first word line among the word lines to read a plurality of verification bit data, wherein the control circuit sets a first read voltage value set as a threshold voltage set for the first word line, wherein the control circuit is further configured to calculate a variation of bit data identified as the first state among the verification bit data and obtain a second read voltage value set based on the variation, wherein the control circuit is further configured to update the threshold voltage set with the second read voltage value set and read data from a first physical page among the physical pages by using the threshold voltage set updated with the second read voltage value set, wherein memory cells constituting the first physical page among the memory cells are electrically connected to the first word line.

* * * * *